United States Patent
Smith et al.

(10) Patent No.: US 12,490,416 B2
(45) Date of Patent: Dec. 2, 2025

(54) THERMALLY DISSIPATIVE ELECTROMAGNETIC INTERFERENCE SHIELD OR COVER FOR AN ELECTRONIC DEVICE

(71) Applicant: BAE SYSTEMS INFORMATION AND ELECTRONIC SYSTEMS INTEGRATION INC., Nashua, NH (US)

(72) Inventors: Sean P. Smith, Merrimack, NH (US); Mark J. Dube, McDade, TX (US); Thomas W. Auletto, Northfield, NH (US); Bernard A. Sacco, Jr., Westford, MA (US); Mark L. Hummel, Peterborough, NH (US); Eric Walther-Grant, Groton, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 371 days.

(21) Appl. No.: 18/077,946

(22) Filed: Dec. 8, 2022

(65) Prior Publication Data
US 2024/0196578 A1  Jun. 13, 2024

(51) Int. Cl.
*H05K 9/00* (2006.01)
*H05K 1/02* (2006.01)

(52) U.S. Cl.
CPC ......... *H05K 9/0032* (2013.01); *H05K 1/0209* (2013.01); *H05K 9/0031* (2022.08)

(58) Field of Classification Search
USPC ....................... 361/799, 816, 818
See application file for complete search history.

(56) References Cited

U.S. PATENT DOCUMENTS

| | | | | |
|---|---|---|---|---|
| 4,942,400 | A | * 7/1990 | Tarzaiski | H05K 1/0216 361/772 |
| 5,557,064 | A | * 9/1996 | Isern-Flecha | H05K 3/284 174/378 |
| 5,592,391 | A | 1/1997 | Muyshondt et al. | |

(Continued)

OTHER PUBLICATIONS

Printer Circuit Board Issues, Chapter 12: Printed Circuit Board (PCB) Design Issues.

(Continued)

*Primary Examiner* — Hung S. Bui
(74) *Attorney, Agent, or Firm* — Sand, Sebolt & Wernow LPA; Gary McFaline

(57) ABSTRACT

A lightweight thermally dissipative EMI shield for electronics is composed of both metallic (e.g., conductive) and non-metallic (e.g., nonconductive) materials. The thermally dissipative EMI shield or cover may be formed of multiple layers of metallic or conductive materials and at least one layer of non-metallic or nonconductive material. There may be a conductive base layer, a lower intermediate nonconductive layer, an upper intermediate conductive layer, and an outer nonconductive layer. The conductive layers operate to thermally dissipate heat and suppress EMI, whereas the nonconductive layers provide lightweight rigidity and stiffness to support the EMI shield and protect components from foreign object ingress or damage of a circuit card or cover is coupled.

17 Claims, 5 Drawing Sheets

(56) References Cited

U.S. PATENT DOCUMENTS

| | | | |
|---|---|---|---|
| 5,639,989 A * | 6/1997 | Higgins, III | H01L 23/552 |
| | | | 174/394 |
| 6,011,691 A | 1/2000 | Schreffler | |
| 6,946,996 B2 | 9/2005 | Koyama | |
| 7,488,901 B2 | 2/2009 | Arnold | |
| 7,550,826 B2 | 6/2009 | Orht et al. | |
| 8,222,541 B2 | 7/2012 | Vander Ploeg et al. | |
| 2002/0166680 A1 | 11/2002 | Mazurkiewicz | |
| 2005/0260938 A1* | 11/2005 | Okuda | B24B 37/16 |
| | | | 451/285 |
| 2009/0002967 A1* | 1/2009 | Asami | H01L 23/552 |
| | | | 257/E23.114 |

OTHER PUBLICATIONS

IPC-2221B, Nov. 2012, Generic Standard on Printed Board Design.
IPC-4101D-WAM1, Jul. 2015, Specification for Base Materials for Rigid and Multilayer Printed Boards.

\* cited by examiner

THERMALLY DISSIPATIVE ELECTROMAGNETIC INTERFERENCE SHIELD OR COVER FOR AN ELECTRONIC DEVICE

TECHNICAL FIELD

The present disclosure relates generally to thermally dissipative electromagnetic interference (EMI) and electromagnetic radiation (EMR) shields or covers for electronic devices or components.

BACKGROUND

Most electronic products emit electromagnetic radiation, generally in the range of 50 MHz to 100 GHz, but not limited to this range especially in light of the many advances in high-speed microprocessor design and the rapidly increasing capabilities of high-speed networking and switching. The problem of emittance of electromagnetic radiation is not new to designers of electronic equipment. Indeed, significant efforts are taken to reduce electromagnetic interference (EMI) and electromagnetic radiation (EMR) and virtually every country has a regulating agency (FCC in the U.S., for instance) that controls the marketing and sale of electronic equipment that do not pass stringent requirements for EMI/EMR, whether radiation or intercepted (also called susceptibility) by an electronic device.

Electromagnetic emissions are the unwanted byproduct of high-frequency electronic signals necessary, for example, to operate an electronic microprocessor or other logic circuitry. The resulting EMI is problematic when it interferes with licensed communications such as television, radio, air communications, navigation, safety and emergency radios, etc.

To meet EMI regulations, most electronic equipment currently employ a combination of two approaches commonly referred to as "source suppression" and "containment." Source suppression attempts to design components and subsystems such that only essential signals are present at signal interconnections, and that all non-essential radio frequency (RF) energy is either not generated or attenuated before it leaves the component subsystem. Containment attempts have traditionally included placing a barrier around the assembled components, subsystems, interconnections, etc., to retain unwanted electromagnetic energy within the boundaries of the product where it is harmlessly dissipated.

This latter approach, containment, is based on a principle first identified by Michael Faraday (1791-1867), that a perfectly conducting box completely enclosing a source of electromagnetic emissions prevents those emissions from leaving the boundaries of the box. This principle is employed in shielded cables as well as in conventional shielded enclosures. Conventional shielded enclosures are typically implemented as a metal box or cabinet that encloses the equipment. The metal box is commonly referred to as a metallic cage and is often supplemented with additional features in an attempt to prevent RF energy from escaping via the power cord and other interconnecting cables. For example, a product enclosure might consist of a plastic structure with a conductive coating on the surface. This approach is commonly implemented in, for example, cell phones. More commonly, the metal enclosure is implemented as a metal cage located inside the product enclosure. Since the EMI suppression necessary for the entire product or system requires that only a portion of the product be shielded, such metallic cages are commonly placed around selected components or subsystems.

There are numerous drawbacks to the use of such metallic cages primarily relating to the lack of shielding effectiveness. Electromagnetic energy often escapes the metallic cage at gaps between the metallic cage and the printed circuit board. Electrical gaskets and spring clips have been developed to minimize such leakage. Unfortunately, such approaches have only limited success at shielding while increasing the cost and complexity of the printed circuit board (PCB). In addition, leakage occurs because the cables and wires penetrating the metallic cage are not properly bonded or filtered as they exit the metallic cage. In addition, the metallic cage creates a stagnant buffer of insulating air around the enclosed component or subsystem causing the temperature of the shielded component or subsystem to increase. In such products, the enclosure typically includes cooling apertures and fans to circulate air around the metallic cage to dissipate the heat. Further drawbacks of metallic cages include the added cost and weight to the printed circuit board assembly, as well as the limitations such metallic cages place on the package design.

Present day solutions typically involve the use of conductively painted plastic housings, conductive gaskets, and/or metal cans that are affixed to a printed circuit board by soldering or similar methods, some of which are semi-permanent. In virtually all cases, the existing solutions are expensive and add to the cost of manufacturing electronic equipment such as cell phones, personal digital assistants, laptop computers, set-top boxes, cable modems, networking equipment including switches, bridges, and cross-connects.

When it comes to EMI shielding at the board of component level, another feature deployed today is to place a conductive surface of the EMI shielding in contact with the guard traces either (1) directly by metalizing a shield surface and placing it in contact with the trace or (2) by metalizing the "outside" surface (from the perspective of the component being shielded) and then using some method of attachment that connects the guard trace with the metalized outside surface. The purpose of the guard traces, based upon the historical use of soldered metal cans, is to provide a point of contact between the EMI shielding and the PCB that can be subject to standardized surface mount technology (SMT) solder reflow processes that ultimately provide a solid connection between the metal can shield and the PCB. And, while the metal can and guard trace become grounded at least one point to the signal, power, or ground plane(s), the amount of peripheral contact between the shield and metal can is largely for the purpose of achieving a tight mechanical seam.

The resultant assembly of the EMI shielding and the electronic component provides adequate shielding for many applications; however, as the frequency of chips increase and the data transmission rates increase, the creation of errant radiation of EMI becomes much easier and more harmful to circuits and components located nearby. Indeed, with the increasing density of chips, the subject of immunity (of one chip relative to another) becomes all the more important. Thus, in general, conventional EMI solutions will increasingly find themselves inadequate for purposes of immunity and indeed, radiated emissions may also become an increasing issue. Furthermore, for microwave devices, especially those that operate of have harmonic frequencies above about 10 GHz radiated emissions will be a significant concern.

The radiation fields within an inner space defined by a printed circuit board and an EMI shield are comprised of very complex combinations of both electric fields (E-fields) and magnetic fields (H-fields) that are bouncing off chip and shield structures forming very complex fields with many resonances. These resonances can be very strong in terms of field strength and can easily be observed at frequencies that are troublesome from an electromagnetic computability (EMC) perspective. In general, there is nothing to contain the radiation escaping from the bottom of the chip except for the phenomena of reflection from the ground plane (the "image" plane) which can, in some situation, improve the radiation emissions problem but is problematical from a design and manufacturing point to achieve.

While EMR fields are very complex, the behavior of EMI shielding can be determined from a measurement of shielding effectiveness (SE). Typically, this is done in the far field where the EMR fields are distinctly plane wave in form. In the near field, EMR is either reflected or absorbed and for the most part, with the drive for lightweight devices and shielding, reflection has been the only viable method of shielding. Controlling EMR is then a matter of designing either solid or intermittent shielding around the chip that increases the SE.

SUMMARY

Given relative small size of a PCB, controlling EMR to reduce EMI should account for the weight of the shield or cover, especially when the shield or cover is formed from solid metal, such as aluminum. It has been determined that a solid metal shield or cover may be too heavy for some applications. Thus, what is needed is a lightweight thermally dissipative EMI shield for electronic devices. This disclosure addresses said need and other issues by providing a thermally dissipative EMI shield or cover that is composed of both metallic (e.g., conductive and thermally dissipative) and non-metallic (e.g., nonconductive) materials. More particularly, this disclosure may provide a thermally dissipative EMI shield or cover formed of multiple layers of metallic or conductive materials and at least one layer of non-metallic or nonconductive material. One particular embodiment may provide a multi-layer matrix EMI shield or cover formed from a conductive base layer, a lower intermediate nonconductive layer, an upper intermediate conductive layer, and an outer nonconductive layer. The conductive layers operate to thermally dissipate heat and suppress EMI, whereas the nonconductive layers provide lightweight rigidity and stiffness to support the EMI shield and protect components from foreign object ingress or damage of the PCB to which the shield or cover is coupled. This multilayer matrix is synergized in such a way to optimize a lightweight structure for thermal heat transfer while simultaneously suppressing EMI to minimized levels.

In one aspect, an exemplary embodiment of the present disclosure may provide a lightweight thermally dissipative EMI shield for electronics is composed of both metallic (e.g., conductive and thermally dissipative) and non-metallic (e.g., nonconductive) materials. The thermally dissipative EMI shield or cover may be formed of multiple layers of metallic or conductive materials and at least one layer of non-metallic or nonconductive material. There may be a conductive base layer, a lower intermediate nonconductive layer, an upper intermediate conductive layer, and an outer nonconductive layer. The conductive layers operate to thermally dissipate heat and suppress EMI, whereas the nonconductive layers provide lightweight rigidity and stiffness to support the EMI shield and protect components from foreign object ingress or damage of a circuit card or cover is coupled.

In another aspect, an exemplary embodiment of the present disclosure may provide a cover for electrical components to shield against electromagnetic interference and dissipative transfer of heat, the cover comprising: a first layer formed from electrically conductive and thermally dissipative material, the first layer having a first surface and a second surface, and the first layer including an outer portion defining an aperture and a patch disposed within the aperture; a second layer formed from nonconductive material, wherein the second layer has a first surface and a second surface, and the first surface of the second layer directly interfaces with the second surface of the first layer; a third layer formed from electrically conductive and thermally dissipative material, wherein the third layer has a first surface and a second surface, and the first surface of the third layer directly interfaces with the second surface of the second layer; a fourth layer formed from nonconductive material, wherein the fourth layer has a first surface and a second surface, and the first surface of the fourth layer directly interfaces with the second surface of the third layer; at least one via extending through the second layer that connects the first layer to the third layer; wherein the cover is adapted to be coupled to a circuit card to dissipate heat from electrical components on the circuit card and simultaneously shield the circuit card from electromagnetic interference.

In yet another aspect, an exemplary embodiment of the present disclosure may provide a cover for electrical components to shield against electromagnetic interference and dissipative transfer of heat, the cover comprising: a first layer formed from electrically conductive and thermally dissipative material, the first layer having a first surface and a second surface; a second layer formed from nonconductive material, wherein the second layer has a first surface and a second surface, and the first surface of the second layer directly interfaces with the second surface of the first layer; a third layer formed from electrically conductive and thermally dissipative material, wherein the third layer has a first surface and a second surface, and the first surface of the third layer directly interfaces with the second surface of the second layer; a fourth layer formed from nonconductive material, wherein the fourth layer has a first surface and a second surface, and the first surface of the fourth layer directly interfaces with the second surface of the third layer; at least one via extending through the second layer that connects the first layer to the third layer; a total density summed from all layers that is less than 2.7 g/cm3; wherein the cover is adapted to be coupled to a circuit card to dissipate heat from electrical components on the circuit card and simultaneously shield the circuit card from electromagnetic interference.

In yet another aspect, an exemplary method or process according to an exemplary embodiment of the present disclosure may provide a method of manufacture of a cover for electrical components to shield against electromagnetic interference and dissipative transfer of heat, the method comprising: forming a first layer of electrically conductive and thermally dissipative material, the first layer having a first surface and a second surface, and the first layer including an outer portion defining an aperture and a patch disposed within the aperture; forming a second layer of nonconductive material, wherein the second layer has a first surface and a second surface; interfacing the first surface of the second layer directly with the second surface of the first layer; forming a third layer of electrically conductive and thermally dissipative material, wherein the third layer has a first surface and a second surface; interfacing the first surface of the third layer directly with the second surface of the second layer; forming a fourth layer of nonconductive material, wherein the fourth layer has a first surface and a second surface; interfacing the first surface of the fourth layer directly with the second surface of the third layer; connecting, conductively, the first layer to the third layer by extending at least one via through the second layer; wherein a total density summed from all layers that is less than 2.7 g/cm3, and wherein the cover is adapted to be coupled to a circuit card to dissipate heat from electrical components on the circuit card and simultaneously shield the circuit card from electromagnetic interference.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1A:
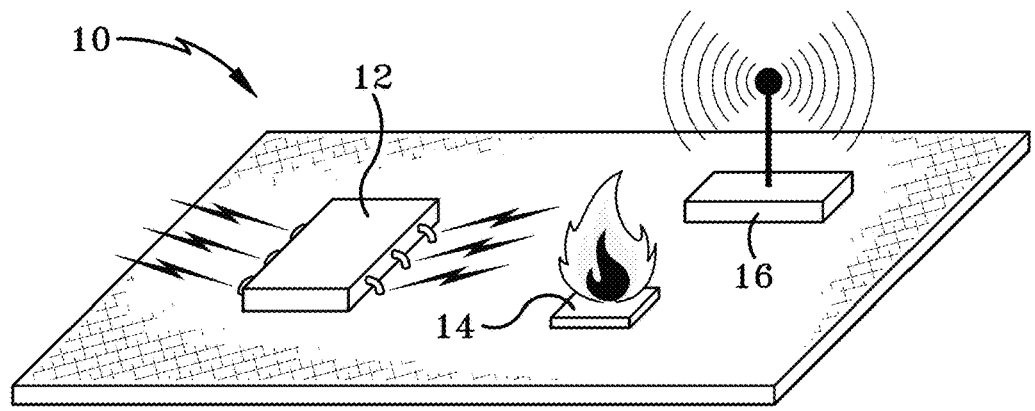
FIG. 1A is a diagrammatic view of a PRIOR ART circuit card having components that emit electromagnetic radiation, heat, and or radio frequency signals.

FIG. 1A depicts an exemplary prior art PCB or circuit card 10 as having components 12, 14, and 16 that output EMR, heat, and/or RF frequencies, respectively. It is known to shield other devices from the EMR, heat, and/or RF frequencies that these components 12, 14, 16 output.

FIG. 1A depicts that component 12 may be a high voltage electrical component with electrical leads that need to be protected in order to prevent injury or damage. For example, if an item or person contacts one of the exposed electrical leads, the high voltage associated with electrical component 12 may shock a person or short circuit component 12. Thus, as will be described in greater detail herein, a shield is typically employed to protect component 12.

Component 14 depicts an exemplary component that outputs heat. Various components, such as component 14 on the circuit card 10 would be considered a thermally challenged electrical component that requires thermal dissipative management techniques.

Component 16 is an exemplary EMI generating or EMI sensitive electrical component that requires shielding for other components on circuit card 10 or and adjacent circuit card having a similar component radiating other frequencies that need shielded from component 16.

Figure 1B:
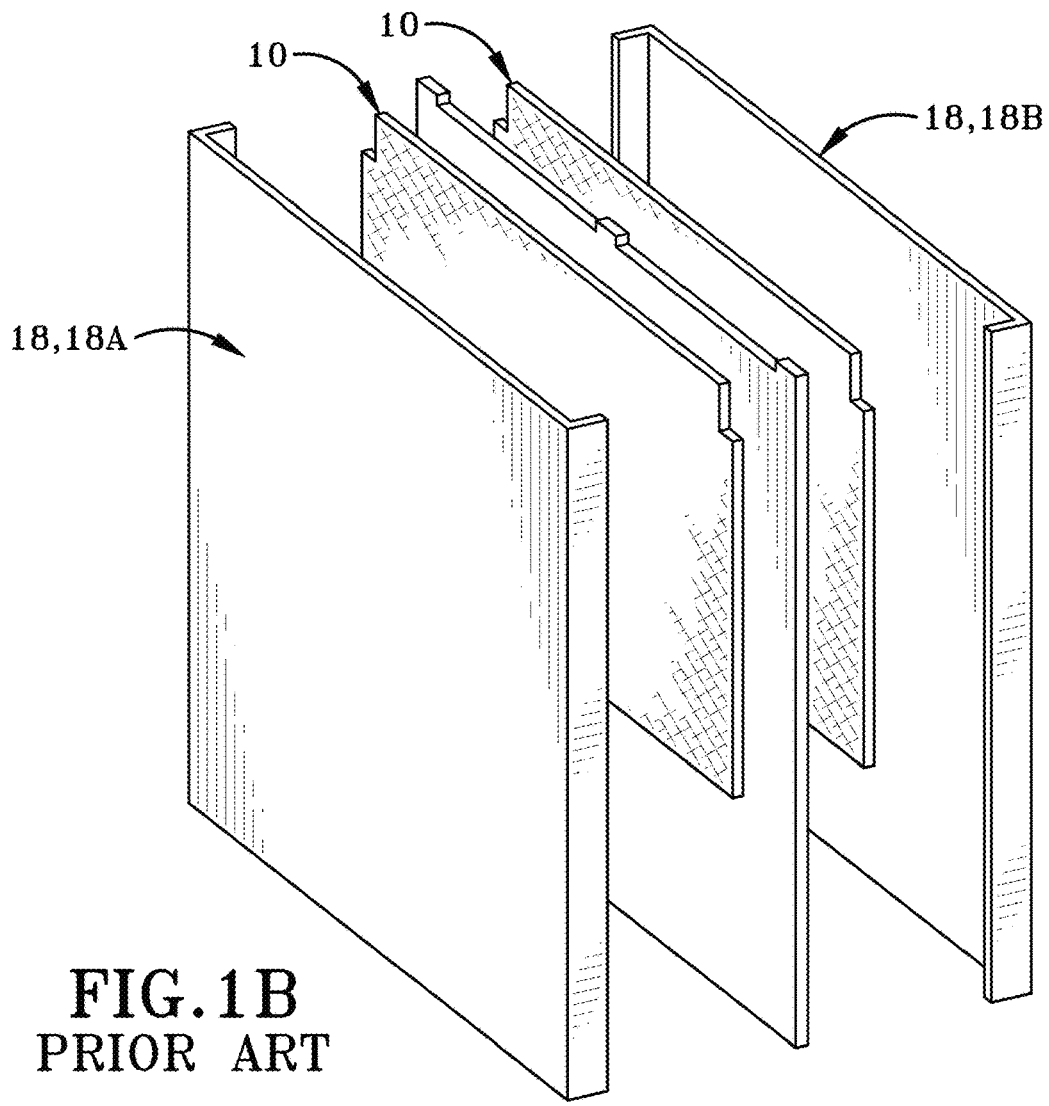
FIG. 1B is a diagrammatic view of a PRIOR ART circuit card having a EMI cover formed of metal surrounding the circuit card.

FIG. 1B depicts an exemplary prior art cover or shield 18 for circuit card 10. Shield 18 may have a first portion 18A and a second portion 18B that collectively shield or cover circuit card 10 from EMR, heat, and/or RF frequencies output from the components 12, 14, and 16 on circuit card 10. Shield 18, and the respective portions 18A, 18B are often formed from a rigid metal, such as aluminum which has an approximate average density of 2.7 g/cm$^3$. Given that the shield 18 is formed from aluminum or other metal, it adds weight to the overall system that the circuit card 10 is part of, especially when there are many circuit cards, each having their own metal shield 18, within the system. It has been determined that the density for aluminum is often too great for certain application specific needs.

Thus, what is needed is a lightweight thermally dissipative EMI shield for electronic devices, such as circuit board 10, or other similar electronic devices that need EMI or EMR shielding.

An improved shield or cover that has a density less than that of aluminum, according to the present disclosure, or various exemplary embodiments of the present disclosure is detailed in FIG. 2-FIG. 5.

FIG. 2-FIG. 5 depict a thermally dissipative EMI shield or cover 20, which addresses this need for a lightweight cover, by providing a cover or shield 20 that is composed of both metallic (i.e., conductive) and nonconductive materials. More particularly, the present disclosure may provide a thermally dissipative EMI shield 20 or cover formed of multiple layers of conductive layers or materials and nonconductive layers or materials. One particular embodiment may provide a multi-layer EMI shield or cover formed from a conductive base layer (i.e., a first layer), a lower intermediate nonconductive layer (i.e., a second layer), an upper intermediate conductive layer (i.e., a third layer), and an outer nonconductive layer (i.e., a fourth layer). The conductive layers operate to thermally dissipate heat and suppress EMI, whereas the nonconductive layers provide lightweight rigidity and stiffness to support the EMI shield and protect components of the PCB or circuit card that the shield or cover is coupled. However, the number and dimensions of intermediate conductive and nonconductive layers may vary depending on the application specific needs of the PCB or circuit card that needs shielding.

Figure 2:
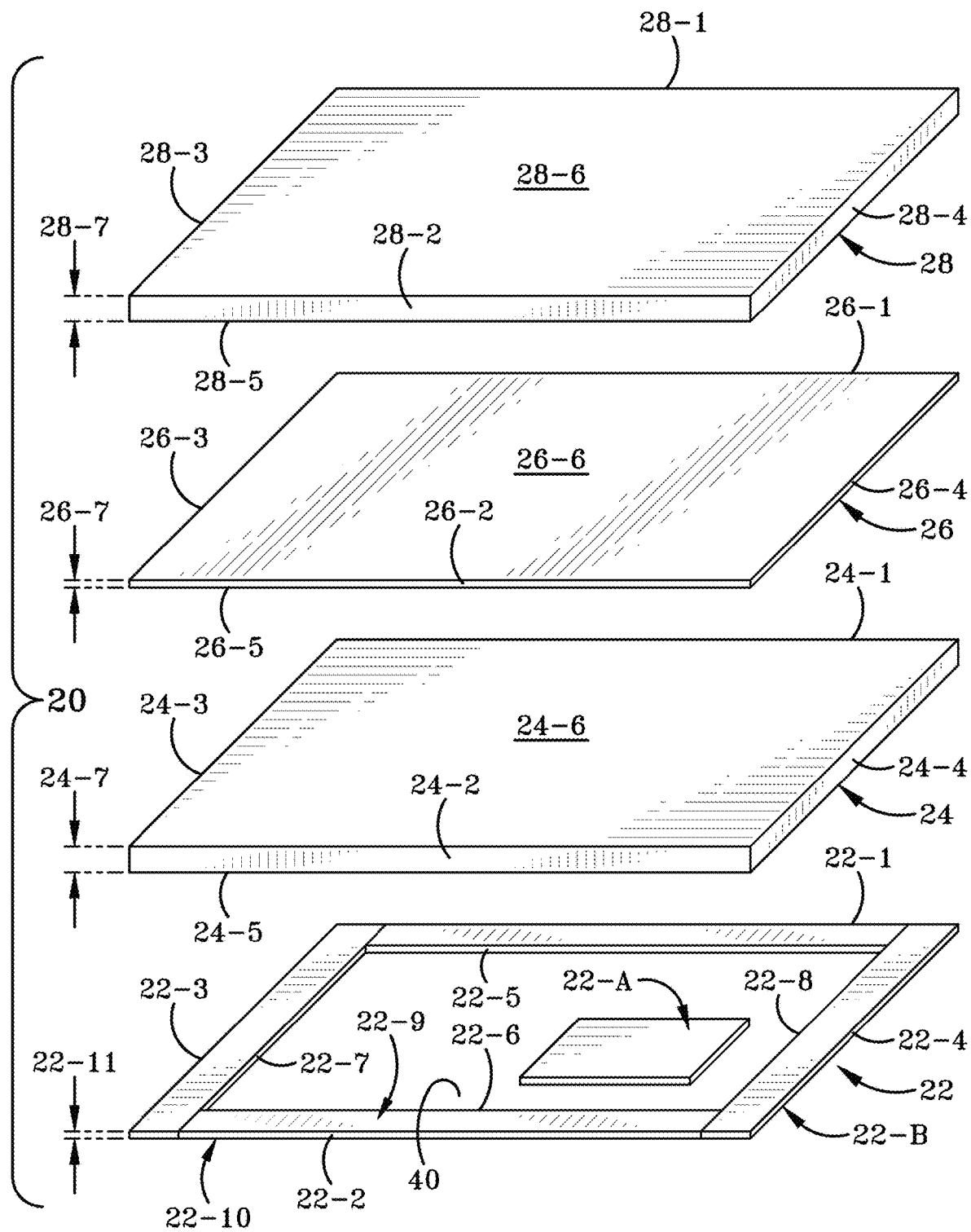
FIG. 2 is an exploded perspective view of a thermally dissipative electromagnetic interference shield or cover for an electronic device according to one exemplary embodiment of the present disclosure.
Figure 3:
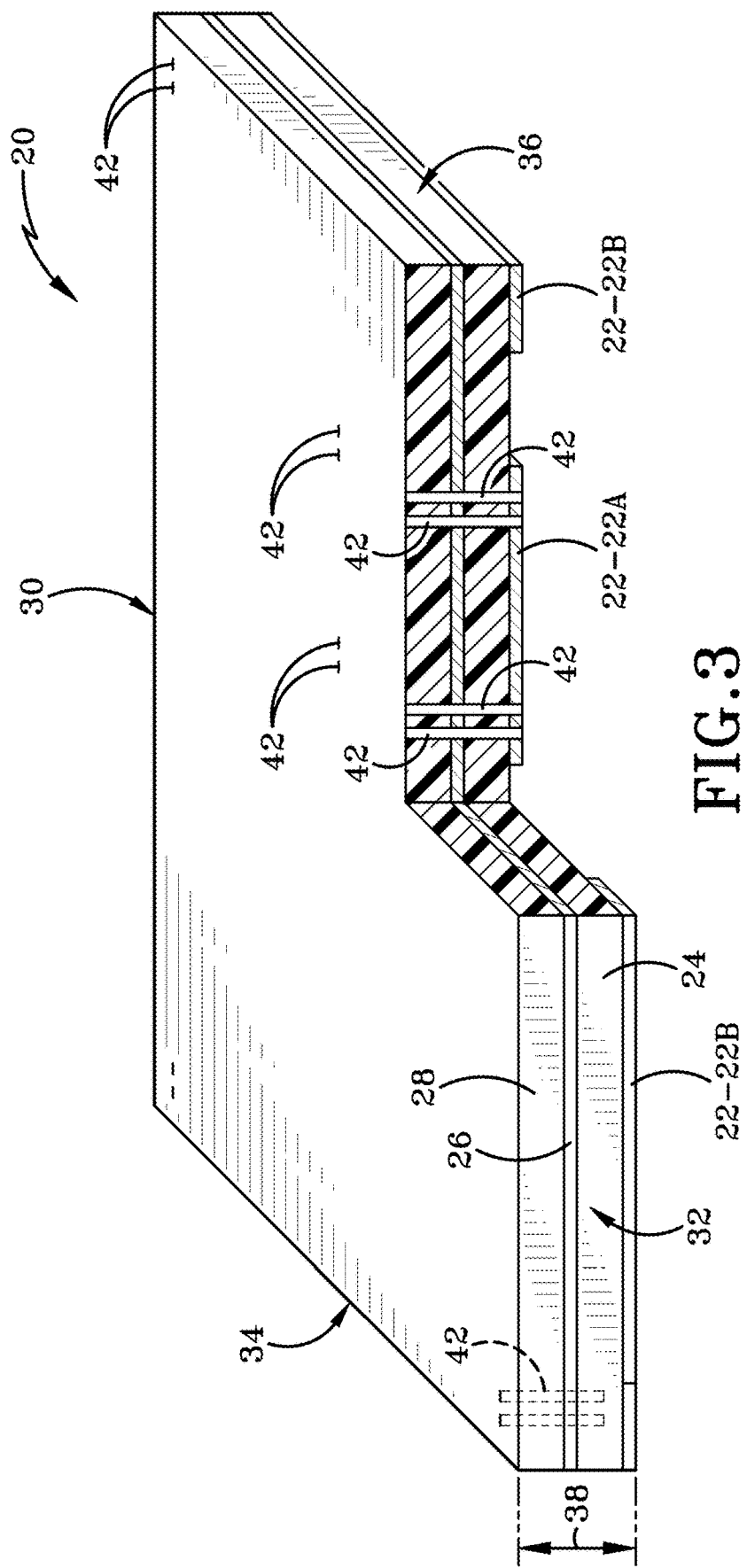
FIG. 3 is a perspective view of the thermally dissipative electromagnetic interference shield or cover for an electronic device according to one exemplary embodiment of the present disclosure, with a portion of the thermally dissipative electromagnetic interference shield or cover for an electronic device shown in cross section.

For example, FIGS. 2-3 depict a four layer shield 20 comprising a conductive first layer 22, a nonconductive second layer 24, a conductive third layer 26, and a nonconductive fourth layer 28. In one embodiment, the conductive material forming the first layer 22 and the third layer 26 are the same material, such as copper or gold or the like. However, it is possible for the first layer 22 and the third layer 26 to be formed from differing conductive materials. Similarly, the nonconductive material forming the second layer 24 and the fourth layer 28 may be formed from the same material. For example, the nonconductive material may be FR-4 such as polymethylmethacrylates, bisphenol-A based epoxy and fiberglass, ceramics such as aluminum oxide and silicon dioxide, Silicon, polyimide (silicon wafers), polyethylene, polyethylene terephthalate, polystyrene, polyphenylsulfone or PPS, polyvinyl chloride or PVC, or silicone rubbers such as RTV (various Surfaces). However, it is possible for the second layer 24 and the fourth layer 28 to be formed from differing nonconductive materials.

Shield 20 has a first and second side edges 30, 32 that are spaced apart and parallel relative to the each other that define a first direction there between. Shield 20 has first and second end edges 34, 36 that are spaced apart and parallel relative to each other that define a second direction therebetween. The first and second end edges 34, 36 are perpendicular to the first and second side edges 30, 32 to define a generally rectangular configuration of shield 20. A thickness of the shield 20 is defined by a dimension 38 that extends in a third direction that is orthogonal to the first direction and the second direction. It should be understood that the shown configuration is exemplary and that the shield 20 may take on alternative geometric configurations if needed to meet the application specific needs of a particular task.

First layer 22 comprises a first side edge 22-1 and a second side edge 22-2 that extend in the first direction parallel to each other. First layer 22 comprises a first end edge 22-3 and a second end edge 22-4 that extend in the second direction parallel to each other. First and second side edges 22-1, 22-2, and first and second end edges 22-3, 22-4, collectively define an outer perimeter of the first layer 22. The first layer 22 also includes an inner edge that is defined by a first side inner edge 22-5 and a second side inner edge 22-6. There is also a first end inner edge 22-7 and a second end inner edge 22-8. Collectively, the inner edges define an opening or aperture 40 of the first layer 22.

First layer 22 comprises a first surface 22-9 opposite a second surface 22-10, wherein the first and second surfaces 22-9, 22-10 are bound by the first and second side edges 22-1, 22-2, the first and second end edges 22-3, 22-4, the first and second side inner edges 22-5, 22-6, and the first and second end inner edges 22-7, 22-8. A thickness 22-11 of the first layer 22 is measured from the first surface 22-9 to the second surface 22-10 in the third direction. Within the aperture 40 of the first layer 22, there is positioned a patch 22-A or partial portion of the first layer 22. Patch 22-A or partial portion of the first layer 22 is a piece of material similar to that of the exterior periphery 22-B of the first layer 22 but that is a distinct component disposed within the aperture (i.e., a smaller patch of material forming the exterior perimeter of first layer 22). The partial portion or patch 22-A of the first layer 22 is configured to be positioned above or over or around a component on the circuit board 10 that is emitting heat, EMR, EMI, or RF frequencies. In one particular embodiment, the partial portion or patch 22-A of the first layer 22 is formed from the same material as the exterior periphery 22-B thereof. However, it is entirely possible for the partial portion or patch 22-A to be formed from a different conductive material than the exterior periphery portion 22-B of first layer 22. Given that the patch 22-A or partial portion of the first layer 22 is a distinct component within the aperture 40, it is to be understood that the surface area of the partial portion or patch 22-A is a smaller area dimension than the area of the aperture 40. For example, the patch 22-A or partial portion of the first layer 22 shown in FIG. 2 is configured as a rectangular element having a similar thickness as the peripheral portion 22-B but disposed entirely within the aperture 40 and not contacting the same. Further, while a single partial portion or patch 22-A of the first layer 22 is shown within the aperture of FIG. 2, it is to be understood that multiple partial portions or patches of the first layer 22 may be positioned within the aperture of the first layer.

Second layer 24 comprises a first side edge 24-1 and a second side edge 24-2 that extend in the first direction parallel to each other. Second layer 24 comprises a first end edge 24-3 and a second end edge 24-4 that extend in the second direction parallel to each other. First and second side edges 24-1, 24-2, and first and second end edges 24-3, 24-4, collectively define an outer perimeter of the second layer 24. Second layer 24 comprises a major first surface 24-5 opposite a major second surface 24-6, wherein the first and second surfaces 24-5, 24-6 are bound by the first and second side edges 24-1, 24-2, and the first and second end edges 24-3, 24-4. A thickness 24-7 of the second layer 24 is measured from the first surface 24-5 to the second surface 24-6 in the third direction. The first surface 24-5 of the second layer 24 is in direct contact with the second surface 22-6 of the first layer 22. In one embodiment the outer perimeter of the second layer 24 is equal to that of the first layer 22.

Third layer 26 comprises a first side edge 26-1 and a second side edge 26-2 that extend in the first direction parallel to each other. Third layer 26 comprises a first end edge 26-3 and a second end edge 26-4 that extend in the second direction parallel to each other. First and second side edges 26-1, 26-2, and first and second end edges 26-3, 26-4, collectively define an outer perimeter of the third layer 26. Third layer 26 comprises a major first surface 26-5 opposite a major second surface 26-6, wherein the first and second surfaces 26-5, 26-6 are bound by the first and second side edges 26-1, 26-2, and the first and second end edges 26-3, 26-4. A thickness 26-7 of the third layer 26 is measured from the first surface 26-5 to the second surface 26-6 in the third direction. The first surface 26-5 of the third layer 26 is in direct contact with the second surface 24-6 of the second layer 24. In one embodiment the outer perimeter of the third layer 26 is equal to that of the second layer 24.

Fourth layer 28 comprises a first side edge 28-1 and a second side edge 28-2 that extend in the first direction parallel to each other. Fourth layer 28 comprises a first end edge 28-3 and a second end edge 28-4 that extend in the second direction parallel to each other. First and second side edges 28-1, 28-2, and first and second end edges 28-3, 28-4, collectively define an outer perimeter of the fourth layer 28. Fourth layer 28 comprises a major first surface 28-5 opposite a major second surface 28-6, wherein the first and second surfaces 28-5, 28-6 are bound by the first and second side edges 28-1, 28-2, and the first and second end edges 28-3, 28-4. A thickness 28-7 of the fourth layer 28 is measured from the first surface 28-5 to the second surface 28-6 in the third direction. The first surface 28-5 of the fourth layer 28 is in direct contact with the second surface 26-6 of the third layer 26. In one embodiment the outer perimeter of the fourth layer 28 is equal to that of the third layer 26.

The present disclosure, according to one exemplary embodiment, provides a unique application of material, similar to a printed wiring board or printed circuit board (PCB), to act as the shield 20 or cover as one component of a circuit card 10. For example, the shield 20 of the present disclosure utilizes the conductive material or conductive layers, such as first layer 22 and third layer 26, to provide a thermo-conductive path to dissipate heat from one or more of the components, such as component 14 on circuit card 10, and is able to shield EMI or EMR or RF frequencies from other components, such as components 12, 16 on circuit card 10. The nonconductive layers of shield 20, such as second layer 24 or fourth layer 28 act as ridged structural reinforcements that are light weight relative to the aluminum or metal that was used in previous shields or covers 18. Thus, the nonconductive layers of shield 20 act as a structural integrity member to stiffen or rigidify (i.e., provide rigidity to) the shield 20.

With continued reference to FIG. 2, more copper layers or more conductive layers can be added to shield 20 if a higher conductive impedance is required for an application specific need. However, this will increase the weight of shield 20. Thus, the designer of shield 20 should balance the amount of conductive material utilized in the first layer 22 and the third layer 26 based on the application specific needs of the desired implementation while still maintaining the total density summed of all layers to be less than that of aluminum.

With continued reference to FIG. 2, the smaller portion or patch 22-A of the first layer 22 represents a localized conductive layer for improved thermal management of selected components. For example, if the circuit card 10 has component 14 that is off-putting a higher amount of heat than other components on the board 10, the patch 22-A may be utilized within the aperture 40 defined by the exterior perimeter periphery portion 22-B of the first layer 22 to dissipate thermal heat and utilizes vias 42 to thermally connect with the third layer 26 that is a solid sheet of conductive material in order to dissipate or act as a heat sink to draw heat away from component 14.

FIG. 3 depicts the shield 20 as the four-layer embodiment composed of first layer 22, second layer 24, third layer 26, and fourth layer 28. Regardless of the number of layers utilized to form shield 20, the total density that is summed from all layers of shield 20 is less than 2.7 g/cm$^3$. In one particular embodiment, the total density of shield 20 is less than 80% of 2.7 g/cm$^3$. In another particular embodiment, the total density of shield 20 is less than 60% of 2.7 g/cm$^3$. By decreasing the density of shield 20 relative to that of aluminum, shield 20 is able to provide the EMI and EMR shielding, as well as the thermal conductivity dissipation, in a matter that reduces weight but maintains rigidity and stiffness of shield 20 in order to protect the circuit card 10. Some exemplary embodiments may provide for some criticality in the claimed range of the total density of shield 20 being less than that of aluminum to reduce weight of shield 20 but maintain rigidity and stiffness of shield 20 in order to protect the circuit card 10.

As depicted in FIG. 3, shield 20 may have stitching vias 42 or other components or connections for thermal and electrical continuity between the layers of conductive material, such as, first layer 22 and third layer 26. In one example, the vias 42 directly connect the patch 22-A of the first layer 22 to the third layer 26. In another example, the vias 42 directly connect the outer portion 22-B of the first layer 22 to the third layer 26. In yet another example, multiple vias 42 are used to connect the outer portion 22-B of the first layer 22 to the third layer 26 and to connect the patch 22-A of the first layer 22 to the third layer 26.

Figure 4:
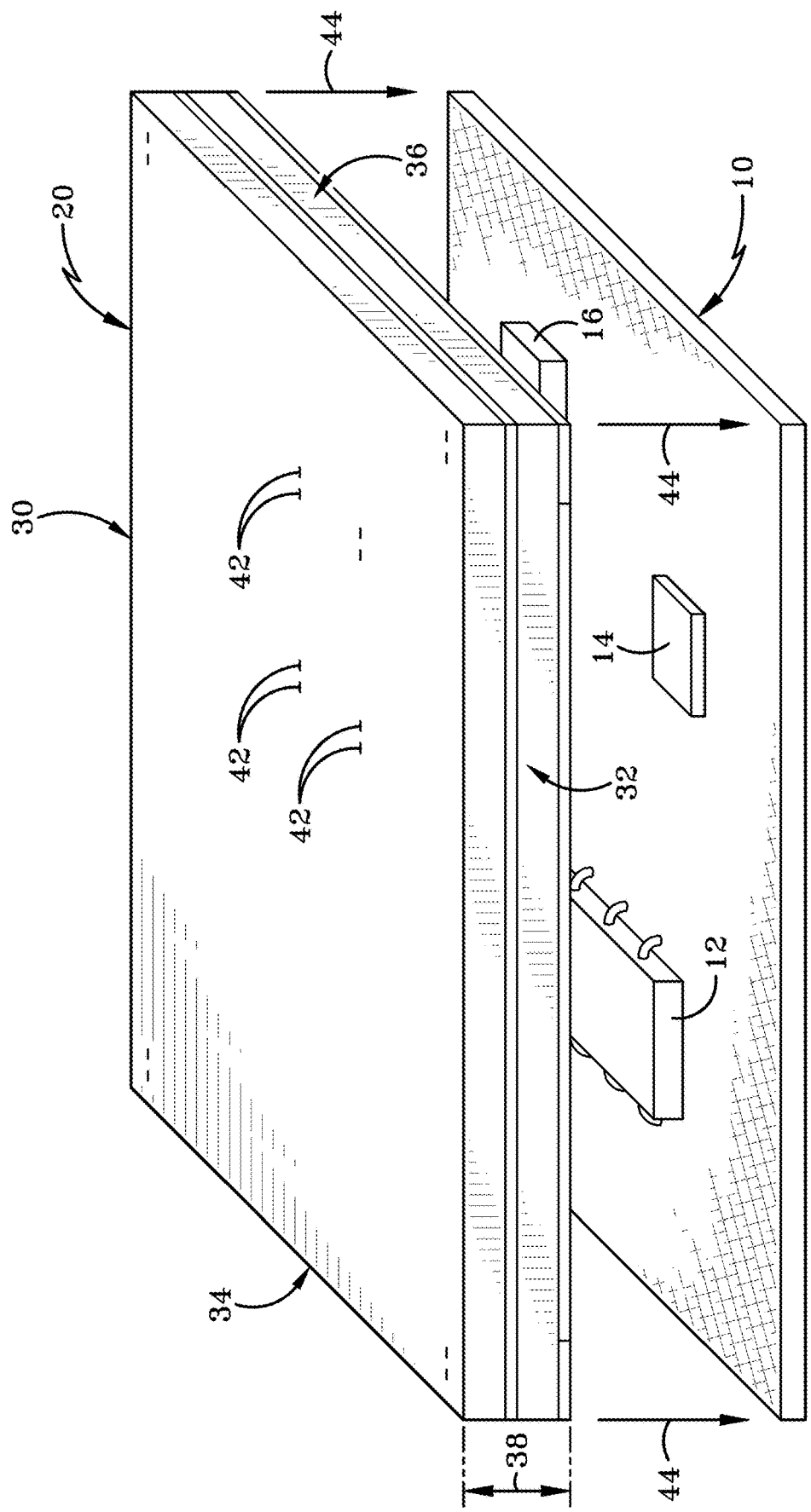
FIG. 4 is an operational perspective view of the thermally dissipative electromagnetic interference shield or cover for an electronic device according to one exemplary embodiment of the present disclosure being coupled to a circuit card.

As depicted in FIG. 4, the manner in which the shield 20 is connected to circuit card 10 is accomplished through or via a screw spacing technique, which is represented by arrows 44. For example, if shield 20 is screwed to circuit card 10, the spacing of the screws will determine the level of EMI isolation because it creates a slot antenna or aperture. Thus, the closer the screw spacing the smaller the wavelength and the higher the frequency of the emitted radiation is provided.

FIG. 4 depicts the four-layer shield 20. However, it is to be understood that the number of layers may vary depending on the application specific needs of shield 20. For example, the appended claims may claim a three layer shield composed of the conductive first layer, the nonconductive second layer, and the conductive third layer.

In the one exemplary embodiment of a four layer shield 20, the second layer 24 and fourth layer 28 are thicker, rigid, light-weight, nonconductive layers that provide structural rigidity or stiffness to the shield or cover 20. Additionally, the conductive layers of the first layer 22 and the third layer 26 are thin layers that provide the thermal conductivity and the EMI shielding. However, it is to be understood that the layers do not necessarily need to be in the order as shown. For example, the first layer may be the lowermost layer and the third layer 26 may be the uppermost layer defining an out exterior surface of shield 20. In this scenario there may be one or more layers, such as second layer 24 between the first layer 22 and the third layer 26. For example, a scenario could be envisioned where the second layer 24 and the fourth layer 28 are directly contacting each other such that the layers would be arranged from the bottom-to-the top as: first layer 22, second layer 24, fourth layer 28, and third layer 26. In another example, a scenario could be envisioned that uses only three layers that would be arranged from the bottom-to-the top as: first layer 22, second layer 24, and third layer 26.

Figure 5:
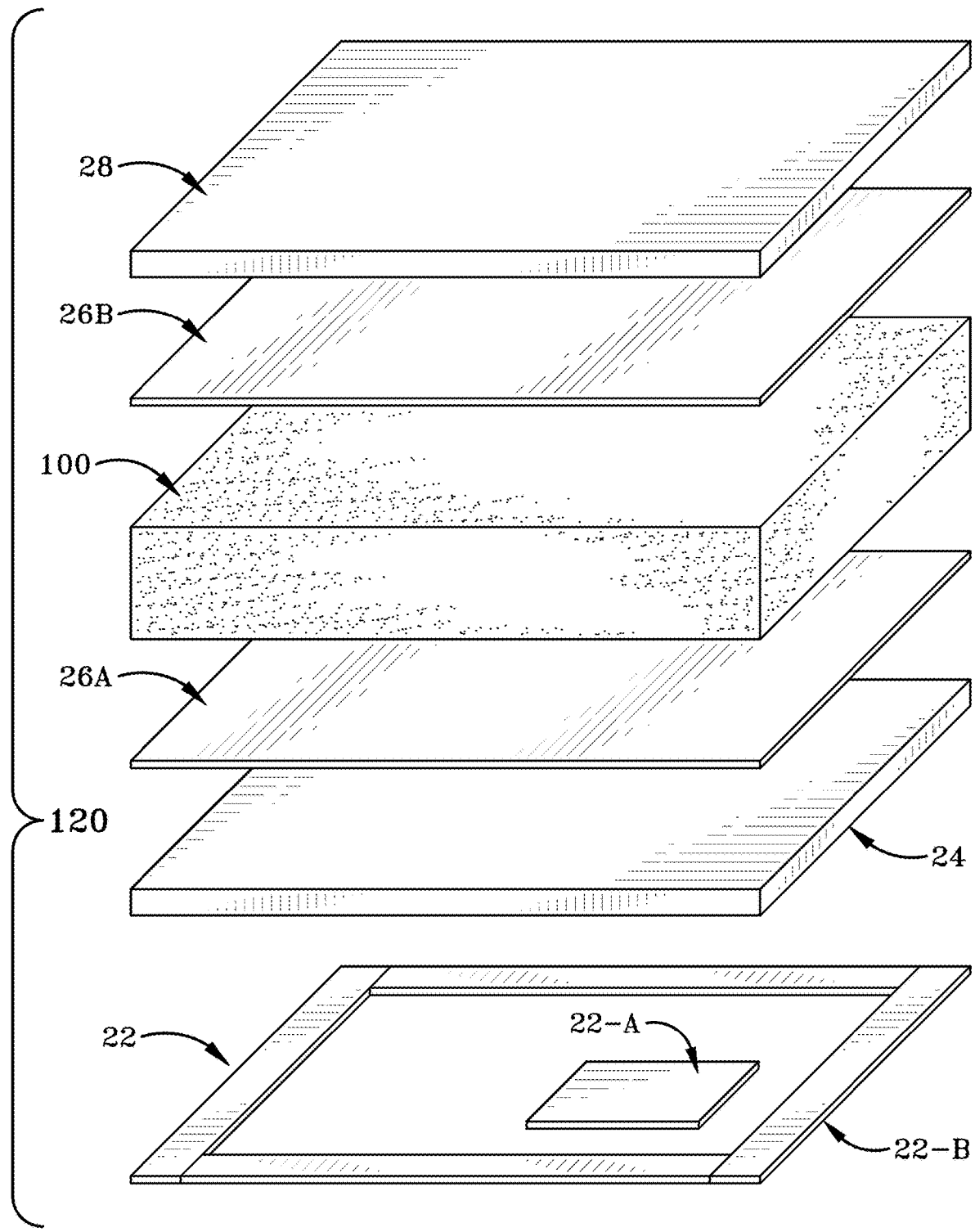
FIG. 5 is an exploded perspective view of a thermally dissipative electromagnetic interference shield or cover for an electronic device according to another exemplary embodiment of the present disclosure.

FIG. 5 depicts an additional embodiment of the present disclosure as shield 120. FIG. 5 depicts that multiple other layers of conductive and/or nonconductive materials can be used to thicken the shield while still maintaining the total summed density for all layers to be less than that of aluminum. For example, an intermediate, nonconductive, but rigid, expansion material can be used as a gap filling layer 100 to fill the space between two or more other layers. For example, this additional material or layer 100 may be laminated between two conductive materials that are also surrounded by other nonconductive material above the base or first layer having the small portion or localized patch of conductive material. Thus, the embodiment of FIG. 5 demonstrates that other materials could be used within the shield 120 or cover that are different from the previously discussed nonconductive materials. For example, if the nonconductive layers are formed from FR-4 material, then the other nonconductive material that could be utilized could be a gap or space filling nonconductive material.

The gap filling material or layer 100 for shield 120 depicted in FIG. 5 may be an RF absorbing foam material. Some exemplary RF absorbing foam materials that may be suitable include, but are not limited to, RFP-DS-Softzorb GDS 122120. This exemplary material offers easier deflection for use in cavities whenever an object may potentially contact with and compress the absorber material causing possible damage to other components. In addition, RFP-DS-Softzorb GDS 122120 has an ability to more thoroughly fill the cavity which greatly increases absorber performance by limiting leakage around the absorbing material. This exemplary RF absorbing material, or another exemplary RF absorbing material, may operate in the frequency range from 18 GHz to 35 GHz, however other operating ranges are possible. It may have a Shore OO hardness of about 55. It may offer a deflection (%) of greater than 30% at 50 psi. It may have a volume resistivity (Ohm-cm) of about 9×10$^{13}$ or more. It may have a dielectric strength (V/mil) of about 15.

Shield 120 may also utilize more conductive layers that shield 20, such as first layer 22, conductive layer 26A and conductive layer 26B, wherein the gap filling layer 100 is disposed between conductive layer 26A and conductive layer 26B. Nonconductive layer 24 may be disposed between conductive first layer 22 and conductive layer 26A. The nonconductive fourth layer 28 may be disposed above conductive layer 26B.

One exemplary reason that a system designer may want to utilize a thicker shield 120 or cover, such as that which is disclosed in FIG. 5 would be to provide a light-weight cover that meets the volumetric application specific needs or form factor or a particular design. For example, if the outer surface of the shield 120 of FIG. 5 needs to lie along a specific plane but the designer does not want to add significant weight to shield 120, the intermediate material may be a gap filling material layer 100 that is rigid, light-weight, but is simply utilized to expand the thickness of the shield 120 to provide the exterior surface at a desired plane or volume.

In each embodiment of shield 20 or 120, the nonconductive layer or layers (i.e., second layer 24 and/or fourth layer 28) may be formed from any of the materials detailed in the IPC-4101D-WAM1 documentation entitled Specification for Base Materials for Rigid and Multilayer Printed Boards, the entirety of which is incorporated herein by reference. For example, FR-4 material (epoxy woven glass)(sometimes also spelled as FR4 material (i.e., sans hyphen)) is shown at IPC-4101 Specification at Sheet Number/21, yet any of the materials shown from Sheet/00 to Sheet/135 are possible and could be suitable for forming the nonconductive layers. In one particular example, the nonconductive layers could be formed by: a printed wiring board (PWB) photo-etch process that optionally includes conductive standoffs or spacers that transition a flat PWB to 3D geometry; additive or 3D printing that allows for 3D sky lining and stair stepping interfacing layer with a circuit card assembly; stamp, form, and laminate sheet stock, films, pre-pregs, applied coatings, and machined shapes which include the common materials of G-10/FR-4, Graphene, aluminum or copper, or expanded foam, including RF absorbing; or plating through ENIG, HASL, or others.

In each embodiment of shield 20 or 120, the conductive layers (i.e., first layer 22 and third layer 26) may be plated. The plating of the conductive layers may be accomplished in a variety of different manners. Some contemplated manners of plating the conductive layers include but are not limited to Hot Air Solder Level (HASL), Lead-Free HASL (LF-HASL), organic solderability preservative (OSP), electroless Nickel/Immersion Gold (ENIG), electroless Nickel/Electroless Palladium/Immersion Gold (ENEPIG); electroless Nickel/Immersion Palladium/Immersion Gold (ENIPIG); electroless Nickel/electroless Palladium/electroless Gold (ENEPEG); Electrolytic Nickel/Electrolytic Gold (Ni/Au); Electroless Nickel/Immersion Gold/Electroless Gold (ENIG/EG); Immersion Tin (ISn); or Immersion Silver (IAg). The advantages of each is detailed in the IPC-2221B documentation entitled Generic Standard on Printed Board Design, the entirety of which is incorporated herein by reference.

As described herein, aspects of the present disclosure may include one or more electrical, mechanical or other similar secondary components and/or systems therein. The present disclosure is therefore contemplated and will be understood to include any necessary operational components thereof. For example, electrical components will be understood to include any suitable and necessary wiring, fuses, or the like for normal operation thereof. It will be further understood that any connections between various components not explicitly described herein may be made through any suitable means including mechanical fasteners, or more permanent attachment means, such as welding or the like. Alternatively, where feasible and/or desirable, various components of the present disclosure may be integrally formed as a single unit.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

As used herein the term "lightweight" refers to the shield having a density being less than aluminum as it has been determine that aluminum shields are too heavy in some applications.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A cover for electrical components to shield against electromagnetic interference and dissipative transfer of heat, the cover comprising:
   a first layer formed from electrically conductive and thermally dissipative material, the first layer having a first surface and a second surface, and the first layer including an outer portion defining an aperture and a patch disposed within the aperture;
   a second layer formed from nonconductive material, wherein the second layer has a first surface and a second surface, and the first surface of the second layer directly interfaces with the second surface of the first layer;
   a third layer formed from electrically conductive and thermally dissipative material, wherein the third layer has a first surface and a second surface, and the first surface of the third layer directly interfaces with the second surface of the second layer;
   a fourth layer formed from nonconductive material, wherein the fourth layer has a first surface and a second surface, and the first surface of the fourth layer directly interfaces with the second surface of the third layer;
   at least one via extending through the second layer that connects the first layer to the third layer;
   wherein the cover is adapted to be coupled to a circuit card to dissipate heat from electrical components on the circuit card and simultaneously shield the circuit card from electromagnetic interference.

2. The cover of claim 1, further comprising:
   a total density summed from all layers that is less than 2.7 g/cm$^3$.

3. The cover of claim 2, wherein the total density is less than 80% of 2.7 g/cm$^3$.

4. The cover of claim 2, wherein the total density is less than 60% of 2.7 g/cm$^3$.

5. The cover of claim 1, wherein the at least one via connects the patch of the first layer to the third layer.

6. The cover of claim 1, wherein the patch is a heat sink that is disposed directly above a component that generates heat during operation of the circuit card.

7. The cover of claim 1, wherein the first layer has a thickness dimension that is the same for both the patch and the outer portion.

8. The cover of claim 1, further comprising:
   an RF absorbing foam disposed between the electrically conductive materials.

9. The cover of claim 1, wherein the nonconductive material is FR-4 material.

10. A cover for electrical components to shield against electromagnetic interference and dissipative transfer of heat, the cover comprising:
    a first layer formed from electrically conductive and thermally dissipative material, the first layer having a first surface and a second surface;
    a second layer formed from nonconductive material, wherein the second layer has a first surface and a second surface, and the first surface of the second layer directly interfaces with the second surface of the first layer;
    a third layer formed from electrically conductive and thermally dissipative material, wherein the third layer has a first surface and a second surface, and the first surface of the third layer directly interfaces with the second surface of the second layer;
    a fourth layer formed from nonconductive material, wherein the fourth layer has a first surface and a second surface, and the first surface of the fourth layer directly interfaces with the second surface of the third layer;
    at least one via extending through the second layer that connects the first layer to the third layer;
    a total density summed from all layers that is less than 2.7 g/cm$^3$;
    wherein the cover is adapted to be coupled to a circuit card to dissipate heat from electrical components on the circuit card and simultaneously shield the circuit card from electromagnetic interference.

11. The cover of claim 10, wherein the total density is less than 80% of 2.7 g/cm$^3$.

12. The cover of claim 11, further comprising:
    an RF absorbing foam disposed between the electrically conductive and thermally dissipative materials.

13. The cover of claim 10, wherein the total density is less than 60% of 2.7 g/cm$^3$.

14. The cover of claim 10, wherein the first layer includes an outer portion defining an aperture and a patch disposed within the aperture.

15. The cover of claim 14, wherein the at least one via connects the patch of the first layer to the third layer.

16. The cover of claim 14, wherein the patch is a heat sink that is disposed directly above a component that generates heat during operation of the circuit card.

17. A method of manufacture of a cover for electrical components to shield against electromagnetic interference and dissipative transfer of heat, the method comprising:
    forming a first layer of electrically conductive and thermally dissipative material, the first layer having a first surface and a second surface, and the first layer including an outer portion defining an aperture and a patch disposed within the aperture;
    forming a second layer of nonconductive material, wherein the second layer has a first surface and a second surface;
    interfacing the first surface of the second layer directly with the second surface of the first layer;
    forming a third layer of electrically conductive and thermally dissipative material, wherein the third layer has a first surface and a second surface;
    interfacing the first surface of the third layer directly with the second surface of the second layer;
    forming a fourth layer of nonconductive material, wherein the fourth layer has a first surface and a second surface;
    interfacing the first surface of the fourth layer directly with the second surface of the third layer;
    connecting, conductively, the first layer to the third layer by extending at least one via through the second layer;
    wherein a total density summed from all layers that is less than 2.7 g/cm$^3$, and wherein the cover is adapted to be coupled to a circuit card to dissipate heat from electrical components on the circuit card and simultaneously shield the circuit card from electromagnetic interference.

* * * * *